United States Patent
Chen et al.

(10) Patent No.: US 7,276,408 B2
(45) Date of Patent: Oct. 2, 2007

(54) REDUCTION OF DOPANT LOSS IN A GATE STRUCTURE

(75) Inventors: Yuanning Chen, Plano, TX (US); Mark Visokay, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 12 days.

(21) Appl. No.: 10/681,399

(22) Filed: Oct. 8, 2003

(65) Prior Publication Data

US 2005/0079655 A1 Apr. 14, 2005

(51) Int. Cl.
*H01L 21/8249* (2006.01)

(52) U.S. Cl. .................... 438/230; 438/595

(58) Field of Classification Search ............... 438/257, 438/261, 265, 299, 216, 591, 303–306, 184–185, 438/229–230, 231–232, 350, 595, 151
See application file for complete search history.

(56) References Cited

U.S. PATENT DOCUMENTS

| | | | |
|---|---|---|---|
| 5,457,061 A * | 10/1995 | Hong et al. .................. 438/261 |
| 5,814,543 A * | 9/1998 | Nishimoto et al. .......... 438/264 |
| 6,137,718 A * | 10/2000 | Reisinger ................ 365/185.03 |
| 6,255,167 B1 | 7/2001 | Wu | |
| 6,303,490 B1 * | 10/2001 | Jeng .......................... 438/627 |
| 6,392,266 B1 | 5/2002 | Robb et al. | |
| 6,423,627 B1 | 7/2002 | Carter et al. | |
| 6,518,111 B1 | 2/2003 | Johnson | |
| 6,528,376 B1 * | 3/2003 | Guo ........................... 438/302 |
| 6,563,175 B2 | 5/2003 | Shiau et al. | |
| 6,720,213 B1 * | 4/2004 | Gambino et al. ........... 438/184 |
| 6,734,108 B1 * | 5/2004 | Jin et al. .................... 438/700 |
| 6,921,711 B2 * | 7/2005 | Cabral et al. .............. 438/589 |
| 6,955,952 B2 * | 10/2005 | Yeo et al. .................. 438/154 |
| 2002/0081850 A1 | 6/2002 | Kobayashi | |
| 2003/0045062 A1 * | 3/2003 | Puchner ..................... 438/303 |
| 2004/0033647 A1 * | 2/2004 | Kim ........................... 438/154 |

* cited by examiner

*Primary Examiner*—Chandra Chaudhari
*Assistant Examiner*—Dana Farahani
(74) *Attorney, Agent, or Firm*—Peter K. McLarty; W. James Brady, III; Frederick J. Telecky, Jr.

(57) ABSTRACT

A semiconductor device includes offset spacers that contact opposing side surfaces of a gate of a gate structure. The offset spacers can be formed by selectively depositing an oxide layer over the gate and the semiconductor substrate so that the opposing side surfaces of the gate e are substantially free of the oxide layer. Offset spacers can then be formed that contact the opposing side surfaces of the gate.

16 Claims, 8 Drawing Sheets

REDUCTION OF DOPANT LOSS IN A GATE STRUCTURE

TECHNICAL FIELD

The present invention relates generally to processes for the manufacture of semiconductor devices and, more particularly, to the formation of nitride spacers for a gate electrode.

BACKGROUND OF THE INVENTION

As feature sizes of metal-oxide-semiconductor (MOS) and complementary metal-oxide-semiconductor (CMOS) devices are reduced, the lateral electric field generated in MOS devices increases. A strong enough electric field gives rise to so-called "hot-carrier" effects in MOS devices. Hot-carrier effects cause unacceptable performance degradation particularly in MOS devices with short channel lengths, e.g., less than 0.5 μm. To overcome the hot carrier instability problems of MOS devices, MOS devices can be provided with shallow lightly doped source/drain regions that extend just to the gate electrode region and heavily doped source/drain regions that are laterally displaced away from the gate electrode region.

The lightly doped regions are used to absorb some of the potential into the drain and thus reduce the electric field. The field is reduced by the lightly doped regions because the voltage drop is shared by the drain and the channel, in contrast to a conventional drain structure, in which almost the entire voltage drop occurs across the channel region. The reduction of the electric field causes a reduction in hot carriers injected into a gate dielectric, which greatly increases the stability of the device.

The lightly doped source/drain regions are typically formed in the semiconductor substrate using the gate electrode and sidewall spacers as a mask during the lightly doped source/drain implantation. The sidewall spacers can be formed alongside the gate after the lightly doped source/drain implantation. The heavily doped regions can then be formed in the semiconductor substrate using the gate electrode and additional sidewall spacers laterally displaced from the gate electrode as a mask during the heavy dose source/drain implantation.

The sidewall spacers, which are used in the formation of the lightly doped regions, can be formed from materials, such as silicon nitride and silicon dioxide. Silicon nitride spacers are typically formed by first providing an oxide layer over the gate. The oxide layer functions as an etch stop during formation of the silicon nitride spacers. The oxide layer is typically provided by thermal oxidation processes, such as rapid temperature processing (RTP). A nitride conformal film can then be deposited over the gate, and the nitride film can be anisotropically etched by an etching process, such as plasma etching.

The thermal oxidation process used to form the oxide layer can potentially cause dopant migration or other unwanted effects in surrounding device areas. Dopant migration from the gate to the oxide layer can deplete dopant ions from the gate, which can adversely affect the electrical performance of the MOS device. For example, a MOS device in which dopant ions are depleted from the gate can have a higher resistance, lower carrier concentration, and lower drive current compared to a MOS device in which the dopant ions are not depleted from the gate.

SUMMARY OF THE INVENTION

The present invention relates generally to a semiconductor device and to a fabrication method for the semiconductor device (e.g., a MOS field effect transistor (MOSFET) of a flash memory). The semiconductor device can include offset spacers that contact opposing side surfaces of a gate of a gate structure. The gate can be doped and include a top surface that interconnects the opposing side surfaces. A poly re-oxide can be formed by selectively depositing (e.g., physical vapor deposition (PVD)) an oxide layer over the gate and the semiconductor substrate so that the opposing side surfaces of the gate are substantially free of the oxide layer. Offset spacers can then be formed that contact the opposing side surfaces of the gate. The offset spacers can mitigate dopant loss and poly-depletion that could potentially occur from the opposing side surfaces of the gate and improve the operation performance of the gate structure.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

The present invention relates generally to a semiconductor device (e.g., MOSFET of a memory array) and a fabrication method for the semiconductor device. The semiconductor device includes offset spacers that contact opposing side surfaces of a gate of a gate structure. The gate can be doped and include a top surface that interconnects the opposing side surfaces. A poly re-oxide can be formed by selectively depositing an oxide layer over the gate of the semiconductor device so that the opposing side surfaces of the gate are substantially free of the oxide layer. A nitride layer can be deposited over the gate and etched to form the offset spacers. The offset spacers in contact with the opposing side surfaces of the gate can mitigate dopant loss and poly-depletion from the gate. Mitigation of dopant loss and poly-depletion from the gate increases the carrier concentration, reduces the external resistance, increases drive current, and device speed of the gate structure compared to a gate structures in which dopant from the gate is allowed to diffuse from the opposing side surfaces.

Figure 1:
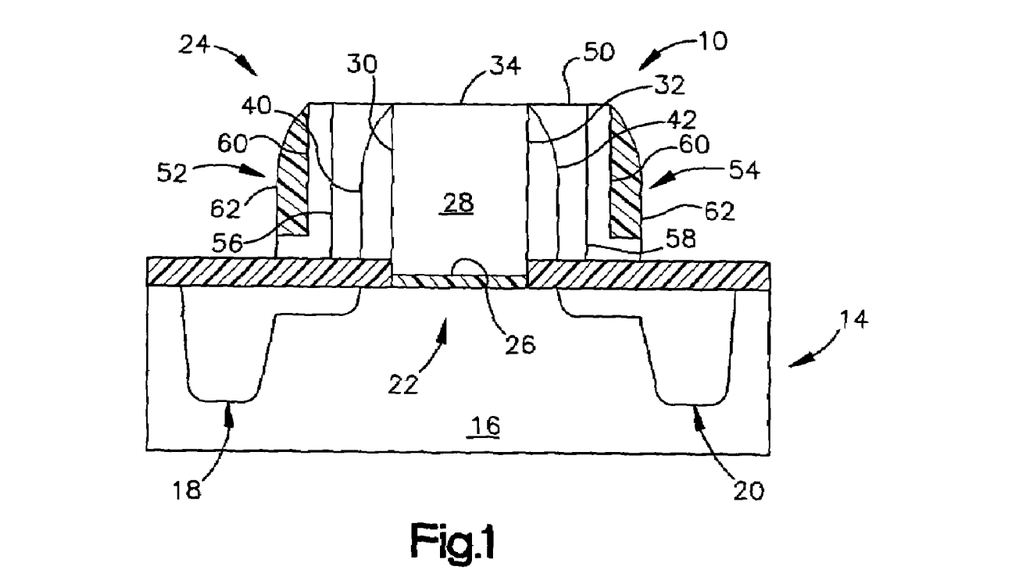
FIG. 1 illustrates a schematic cross-sectional view of a MOS structure in accordance with an aspect of the invention.

FIG. 1 illustrates a PMOS structure 10 of a semiconductor device in accordance with an aspect of the invention. The PMOS structure 10 can be formed of a substrate material 14 having embedded therein an n-well 16. The substrate material 14 can be a p-type semiconductor material and the n-well 16 can be formed in the p-type semiconductor material, for example, by implanting an n-type dopant, such as phosphorous (P), in the p-type substrate material 14. It is to be appreciated that the PMOS structure is provided for illustrative purposes and that the substrate 14 can include a plurality of PMOS structures and other integrated circuit devices.

The PMOS structure 10 can include spaced apart source and drain regions 18 and 20, which are formed in the n-well 16, and a channel region 22, which is defined between the source and drain regions 18 and 20. The source region 18 and drain region 20 can be formed respectively by selectively implanting a light source/drain (S/D) p-type implant, such as boron 11 ($B_{11}$), boron difluoride ($BF_2$), or any other p-type dopant and a heavier dose of a S/D implant (e.g., $B_{11}$ and $BF_2$) in the n-well 16. The source region 18 and drain region 20 can also include a p-source contact and a p-drain contact (not shown). The source region 18 and drain region 20 can be silicided to reduce contact resistance and prevent junction spiking.

A gate structure 24 can be formed over the channel region 22. The gate structure 24 includes a relatively thin gate dielectric layer 26 (e.g., having a uniform thickness between about 5 Å and about 125 Å) that can be formed (e.g., by thermal oxidation) over the channel region 22. The gate dielectric layer 26 can be an oxide (e.g., silicon dioxide ($SiO_2$)) or any other dielectric material suitable for use as an insulator in a MOS device. A gate electrode 28 can be formed (e.g., by chemical vapor deposition (CVD)) over the gate dielectric layer 26. The gate electrode has opposing side surfaces 30 and 32 and a top surface 34 that interconnects the opposing side surfaces 30 and 32. The gate electrode 28 can comprise, for example, a polysilicon gate material or a re-crystallized polysilicon gate material that is doped with a p-type dopant (e.g., $B_{11}$ and $BF_2$).

The gate structure 24 can also include offset spacers 40 and 42. The offset spacers 40 and 42 can be formed (e.g., by CVD and RIE etching) adjacent to and in contact with the gate electrode 28 substantially along the opposing side surfaces 30 and 32 of the gate electrode. The offset spacers 40 and 42 can mask the implantation of the lightly dose source/drain implant into the n-type well 14 immediately adjacent the gate electrode 28 area to mitigate shorting the source region 18 and drain region 20 to the gate electrode 28.

The offset spacers 40 and 42 can comprise a nitride material, such as silicon nitride ($Si_3N_4$). Nitride materials, such as silicon nitride, have high dielectric constants (k) (e.g., about 7) and are resistant to implantation of dopants by doping processes and to diffusion (or migration) of dopants from doped materials in contact with the nitride material. By forming the offset spacers 40 and 42 from a nitride material that contacts the opposing side surfaces 30 and 32 of the gate electrode 28, dopant outdiffusion from the opposing side surfaces 30 and 32 of the gate electrode 28 can be mitigated. Thus, dopants within the gate electrode 28 can be readily retained and poly-depletion of the gate electrode 28 can be mitigated.

The gate structure 24 can further include a cap layer 50 that overlies the offset spacers 40 and 42 as well as the source region 18 and drain region 20, which are formed in the n-well 16 of the substrate 14. The cap layer 50 can be formed by depositing (e.g., CVD) an insulating material, such as $SiO_2$ over the offset spacers 40 and 42 and the substrate 14. The cap layer can function as an etching stop during processing of the gate structure 24.

Sidewall spacers 52 and 54 can be formed over the cap layer 50. The sidewall spacers 52 and 54 can be laterally displaced from the gate 28 and contact the cap layer 50 along outer surfaces 56 and 58 of the cap layer 50. The sidewall spacers 52 and 54 can each include a nitride layer 60 and an oxide layer 62. The nitride layer 60 can be formed from a nitride material (e.g., $Si_3N_4$) that can be deposited (e.g., by CVD) over the cap layer. The oxide layer 62 can be formed from an oxide material (e.g., $SiO_2$) that can be deposited (e.g., by CVD) over the nitride layer and etched (e.g., by RIE etching). The sidewall spacers 52 and 54 can mask the implantation of the heavy dose source/drain implant into the n-well 16 of the p-type substrate 14.

Figure 2:
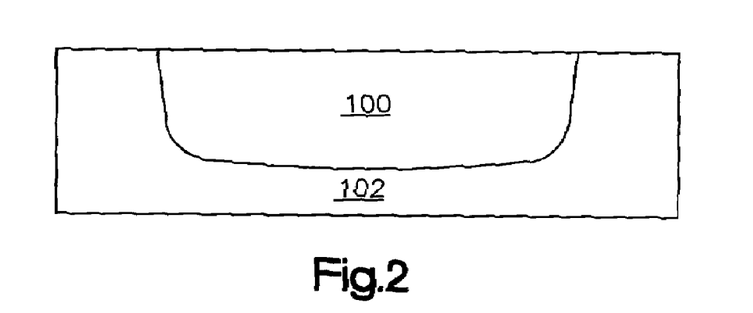
FIG. 2 illustrates a schematic cross-sectional view of a substrate with an n-well.

FIGS. 2-11 illustrate a methodology of fabricating part of a gate structure of a semiconductor device. Referring to FIG. 2, an n-well 100 can be formed in a p-type substrate layer 102 by implanting an n-type dopant, such as phosphorous and/or arsenic, into the p-type substrate layer 102. The p-type substrate layer 102 can be formed from a semiconductor material, such as silicon or polysilicon. The substrate layer 102, however, could be formed from any material, such as gallium arsenide, germanium, silicon-germanium, epitaxial formations, silicon carbide, indium phosphide, silicon-on-insulator substrates (SOI), strained Si substrates, and/or other semiconductor substrate materials.

During formation of the n-well 100 in the p-type substrate layer 102, a patterned photoresist layer (not shown) can be provided on the p-type substrate 102. The patterned photoresist layer can have a thickness suitable for carrying out the present invention. Accordingly, the thickness of the patterned photoresist layer can vary in correspondence with the wavelength of radiation used to pattern the photoresist layer. The patterned photoresist layer can be formed by providing a photoresist layer over the p-type substrate layer 102 via conventional spin-coating or spin casting deposition techniques. The photoresist layer can be etched (e.g., anisotropic reactive ion etching (RIE)) to provide the patterned photoresist layer. A selective etch technique can be used to etch the photoresist layer at a relatively greater rate as compared to the rate of the underlying p-type substrate layer 102 to provide the patterned photoresist layer. The patterned photoresist layer can be used as a mask to define the area of the n-well 100 during implantation of the n-type dopant.

The implantation of the n-type dopant can be performed, for example, using an ion implanter that accelerates the dopant ions (e.g., P) at a high energy (e.g., about 150 to about 250 KeV). In an aspect of the invention, the n-well 100 can be formed with multiple implants, such as a channel stop implant ($C_s$) and a well implant ($W_I$) implant. The $C_s$ implant puts the peak doping concentration at the bottom of the n-well 102. It is designed to raise the turn-on voltage of the PMOS structure. The $C_s$ implant can comprise a phosphorous implant at doses of about $3 \times 10^{12}$ cm$^2$ to about $7 \times 10^{12}$ cm$^2$ at energies of about 180 keV to about 330 keV. The $W_I$ is a high-energy implant and forms a deep low resistance region in the n-well. This low resistance region keeps the voltage close to ground everywhere in the n-well 100 and prevents transient voltages from building up. The $W_I$ implant may comprise a phosphorous implant at doses of about $2 \times 10^{13}$ cm$^2$ to about $9 \times 10^{13}$ cm$^2$ at energies of about 350 keV to about 850 keV.

After ion implantation, the patterned photoresist can be stripped off the substrate 102 (e.g., Ultra-Violet (UV) Ozone ($O_3$)/Sulfuric Acid ($H_2SO_4$) and cleaned by wet chemical cleanup processes. Those skilled in the art would be familiar with a variety of different wet chemical cleanup procedures that can be employed to clean the structure.

Figure 3:
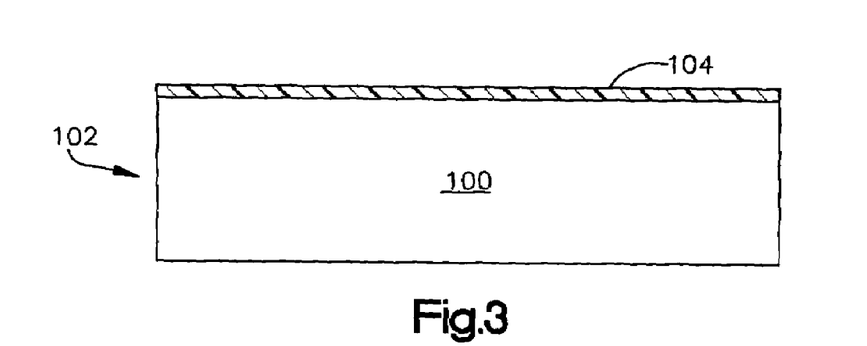
FIG. 3 illustrates a schematic cross-sectional view of the n-well of FIG. 2 after a dielectric layer has been formed over the n-well.

FIG. 3 illustrates that a gate dielectric layer 104 can be formed over the n-well 100 that was formed in the p-type substrate layer 102. The dielectric layer 104 can be formed by an oxidation process, which forms an oxidation layer (e.g., silicon dioxide ($SiO_2$) layer). The gate dielectric layer 104 can have a thickness of about 5 Å to about 125 Å, and be formed by a wet and/or dry thermal oxidation processing. Thermal oxidation is the standard method of forming a gate dielectric layer 104 having a thickness of about 5 Å to about 125 Å. It is to be appreciated that alternate methodologies besides thermal oxidation can be employed to form the gate dielectric layer 104. For example, any suitable technique (e.g., plasma enhanced CVD, thermal enhanced CVD and spin on techniques) may be employed in forming the gate dielectric layer 104.

Additionally, alternate materials can be employed to provide the gate dielectric layer 104. The gate dielectric layer 104 can be, for example, $SiO_2$ or another suitable oxide material that can perform the operation associated with the gate dielectric layer 104. Examples of some materials that could be utilized as the gate dielectric layer 104 include $AlO_3$, $ZrO_2$, $HfO_2$ (AlHf) $O_x$, $HfO_2$, $La_2O_3$ and $Y_2O_3$, hafnium silicon oxynitride and silicon oxynitride to name a few. Those skilled in the art will understand and appreciate appropriate types of deposition techniques that can be employed to grow suitable crystalline structures to the form gate dielectric layer 104, such as those identified above. It is to be further understood and appreciated that other materials also could be employed to form the gate dielectric layer 104.

Figure 4:
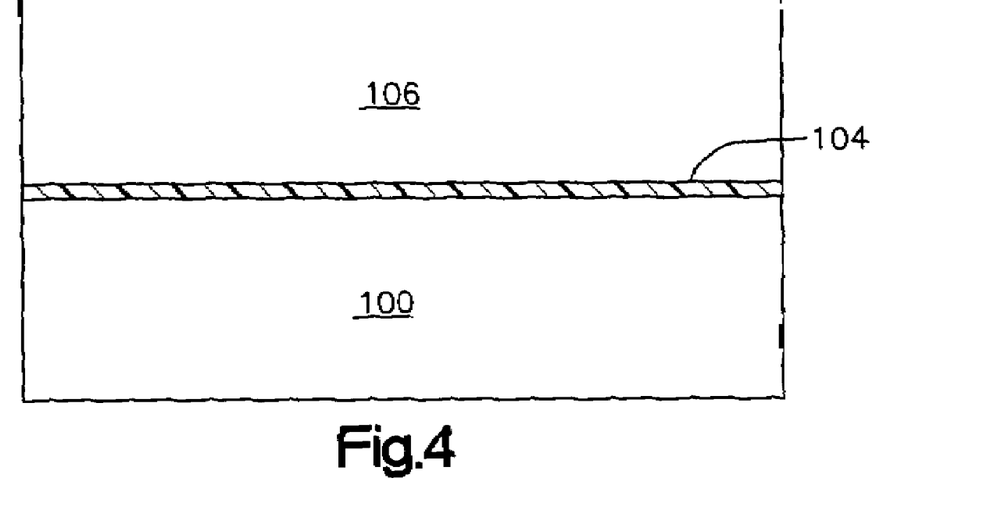
FIG. 4 illustrates a schematic cross-sectional view of the n-well of FIG. 3 after a conductive layer has been deposited over the dielectric layer.

FIG. 4 illustrates that a conductive layer 106 can be deposited over the dielectric layer 104 to provide the gate electrode. The conductive layer 106 can be doped with a p-type dopant, such as $B_{11}$ and $BF_2$. If the conductive layer 106 is comprised of polysilicon, the conductive layer 106 may be formed using any suitable technique including CVD techniques, such as low-pressure CVD (LPCVD) or plasma-enhanced CVD (PECVD). The polysilicon can be formed in a polycrystalline state or an amorphous state, which is later converted to a crystalline state. The polysilicon can also be formed using in-situ doping techniques and implantation techniques. If the conductive layer 106 is comprised of amorphous silicon or germanium, standard deposition techniques may be employed.

Figure 5:
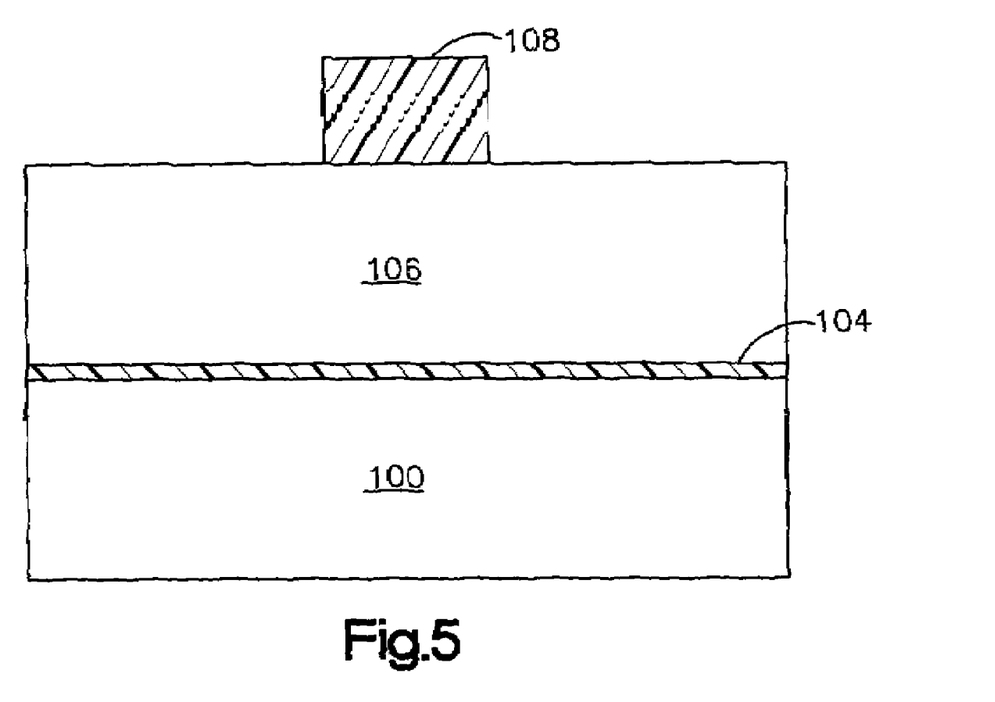
FIG. 5 illustrates a schematic cross-sectional view of the structure of FIG. 4 after a mask has been formed over the conductive layer.

FIG. 5 illustrates that a patterned photoresist layer 108 can be formed over the conductive layer 106. The patterned photoresist layer 108 can have a thickness suitable for carrying out the present invention. Accordingly, the thickness of the patterned photoresist layer 108 can vary in correspondence with the wavelength of radiation used to pattern the photoresist layer. The patterned photoresist layer 108 can be formed by providing a photoresist layer over the conductive layer 106 via conventional spin-coating or spin-casting deposition techniques. The photoresist layer can be etched (e.g., anisotropic reactive ion etching (RIE)) to provide the patterned photoresist layer 108. A selective etch technique can be used to etch the photoresist layer at a relatively greater rate as compared to the rate of the underlying conductive layer 106 to provide the patterned photoresist layer 108. The patterned photoresist layer 108 can be used as a mask 108 to define the area of a gate electrode (FIG. 6) during a subsequent etching process.

Figure 6:
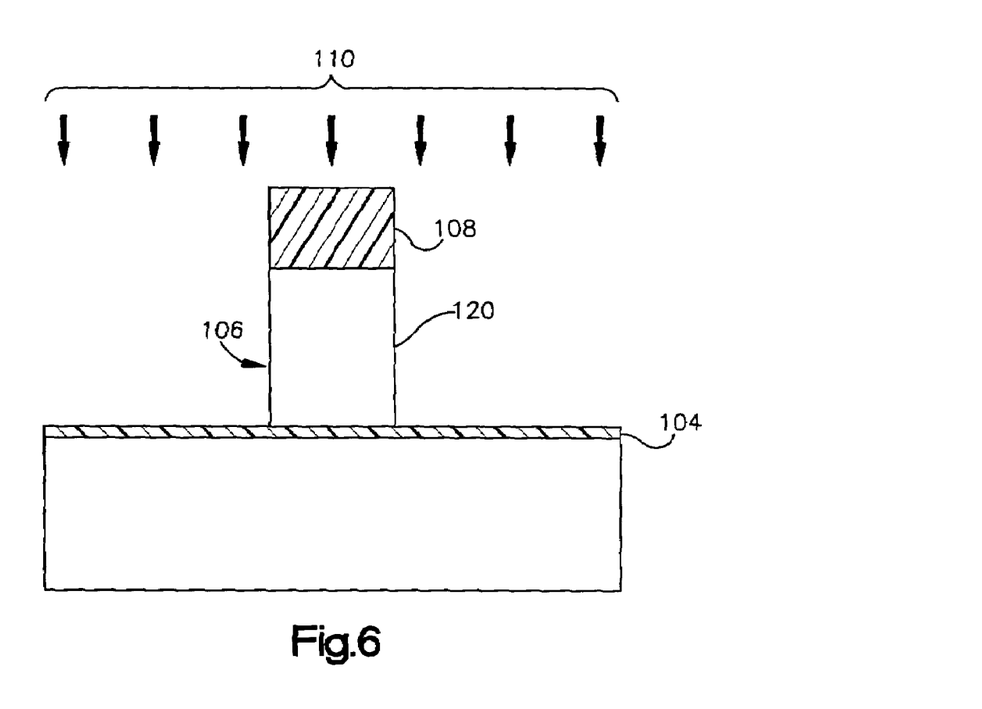
FIG. 6 illustrates a schematic cross-sectional view of the structure of FIG. 5 after an etching process has been initiated.

FIG. 6 illustrates an etching process 110 being performed to remove the conductive layer from the p-type substrate 102 to form the gate electrode 120. Any suitable etch technique can be used to etch the conductive layer 106. For example, the conductive layer 106 can be anisotropically etched with a plasma gas(es), (e.g., carbon tetrafluoride ($CF_4$) containing fluorine ions) in a commercially available etcher, such as a parallel plate RIE apparatus or, an electron cyclotron resonance (ECR) plasma reactor. Any combination of a wet or dry etch process can be employed to etch the conductive layer 106. In one aspect, a selective etch technique can be used to etch the conductive layer 106 at a relatively greater rate as compared to the rate of the patterned photoresist layer 108.

Following the etching process 110, the patterned photoresist layer 108 can be stripped off the gate electrode (e.g., Ultra-Violet (UV) Ozone ($O_3$)/Sulfuric Acid ($H_2SO_4$) and cleaned by wet chemical cleanup processes. Those skilled in the art would be familiar with a variety of different chemical cleanup procedures that can be employed to clean the structure.

Figure 7A:
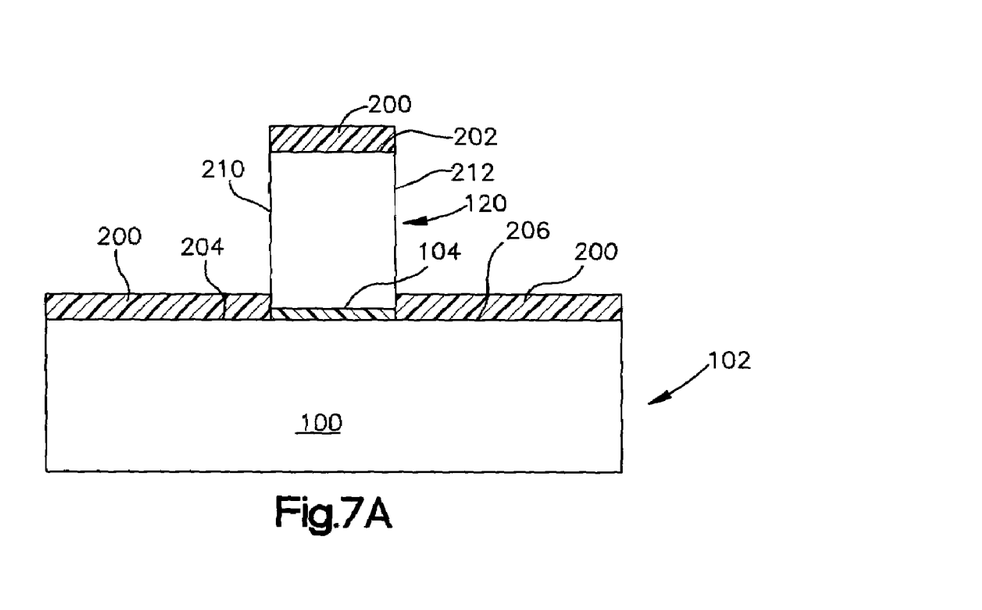
FIG. 7A illustrates a schematic cross-sectional view of the structure FIG. 6 after a poly re-oxide layer has been deposited.

FIG. 7A shows that an oxide material 200 can be deposited over the gate 120 and the n-well 100 so that a top surface 202 of the gate 120 and surfaces 204 and 206 of the n-well 100 adjacent the gate are covered with a layer of oxide material 200 having a first thickness (e.g., about 15 Å in thickness), and the opposing side surfaces 210 and 212 of the gate are substantially free of the oxide material 200 (e.g., the thickness of the oxide material 200 on the opposing side surfaces 210 and 212 of the gate 120 is less than about 2 Å). The oxide material 200 functions as an etching stop during subsequent formation of offset spacers (FIG. 9) that contact the opposing side surfaces 210 and 212 of the gate 120. The oxide material 200 can create an accumulation layer, which can potentially increase carrier concentration, reduce external resistance, increase drive current, and device speed of the gate structure.

The oxide material 200 can comprise any oxide material typically used as an insulator and as an etching stop during the fabrication of a semiconductor device. Examples of some oxide materials can be $SiO_2$, $AlO_3$, $ZrO_2$, $HfO_2$ (AlHf) $O_x$, $HfO_2$, $La_2O_3$, $Y_2O_3$, silicon oxynitride, and hafnium silicon oxynitride. The oxide material can affect the final distribution of dopants in the gate 120. The dopants in the gate 120 can be more soluble in the oxide material than the gate 120 and can potentially diffuse into the oxide layer. By depositing the oxide material on just the top surface 202 of the gate 120 and the adjacent surfaces 204 and 206 of the substrate 102, dopant depletion (dopant diffusion) from the opposing side surfaces 210 and 212 of the gate 120 can be effectively mitigated compared to gate structures in which the opposing sides surfaces of the gate are covered with an oxide layer. It is to be further understood and appreciated that other oxide materials can also be employed.

Figure 7B:
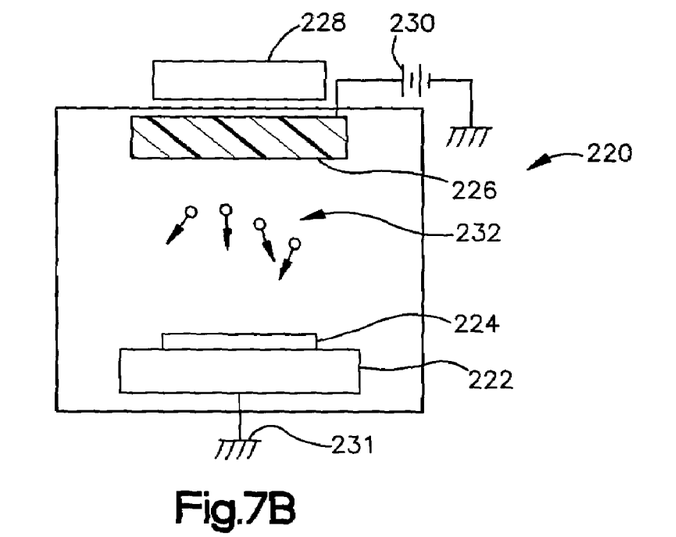
FIGS. 7B, 7C, 7D, and 7E illustrate, respectively, apparatuses for depositing the etch stop layer of FIG. 7A.

A variety of techniques can be used to deposit the oxide material 200 on the top surface 202 of the gate 120 and the adjacent surfaces 204 and 206 of the n-well 100 without depositing the oxide material 200 on the opposing side surfaces 210 and 212 of the gate 120. An example of one technique that can be used to deposit the oxide material 200 is physical vapor deposition (PVD) (i.e., sputtering). FIG. 7B illustrates a conventional isotropic sputtering apparatus 220 that can be used to deposit the oxide material 200 on the top surface 202 (FIG. 7A) of the gate 120 and the adjacent surfaces 204 and 206 of the n-well 100 without depositing the oxide material on the opposing side surfaces 210 and 212 of the gate 120. A conventional sputtering apparatus 220 may include a substrate holder 222. The substrate holder 222 can hold a substrate 224, that is to be processed, in an essentially parallel orientation to a target 226. The target 226 may be formed from an oxide material that is to be deposited (e.g., $SiO_2$). Reactive sputtering could also be used wherein a compound material (e.g., $SiO_2$) is deposited using an unoxidized target material (e.g., Si) and a reactive sputtering gas (oxygen in this case).

A magnet 228 may be disposed on one surface of the target 226, while an opposite surface can face the substrate 224. The target 226 may also be connected to a DC or RF power source 230 while the substrate 224 may be connected to ground 231. The application of a voltage to the target 226 can result in the formation of a plasma in which the ionized species are accelerated into the target material, a portion of which is ejected due to the collision, resulting in sputtered particles 232 being released from the target 226. In the conventional approach illustrated, sputtered particles 232 can be incident on the substrate 224 from various directions due to scattering and the trajectory of emission from the target material. Consequently, the sputtering apparatus 220 can provide isotropic sputtering particles 232 on the top surface 202 of the gate 120 and the substrate 102 with a minimal amount of particles 232 on the opposing side surfaces 210 and 212 of the gate 120.

It may be desirable to use anisotropic sputtering methods for depositing the oxide material 200 when a high density of gate structures are formed on a substrate, such as the formation of multiple gate structures for a memory array. Such methods may generate sputtered particles that have a substantially vertical incidence with the top surface of the gate and the substrate. In such an environment, the number of sputtered particles that adhere to the opposing side surfaces of the gate is further reduced with respect to isotropic sputtering methods. Examples of anisotropic sputtering methods include a collimated sputter method, a "long throw" sputtering method, and an ionized metal plasma sputtering method, to name a few.

Figure 7C:
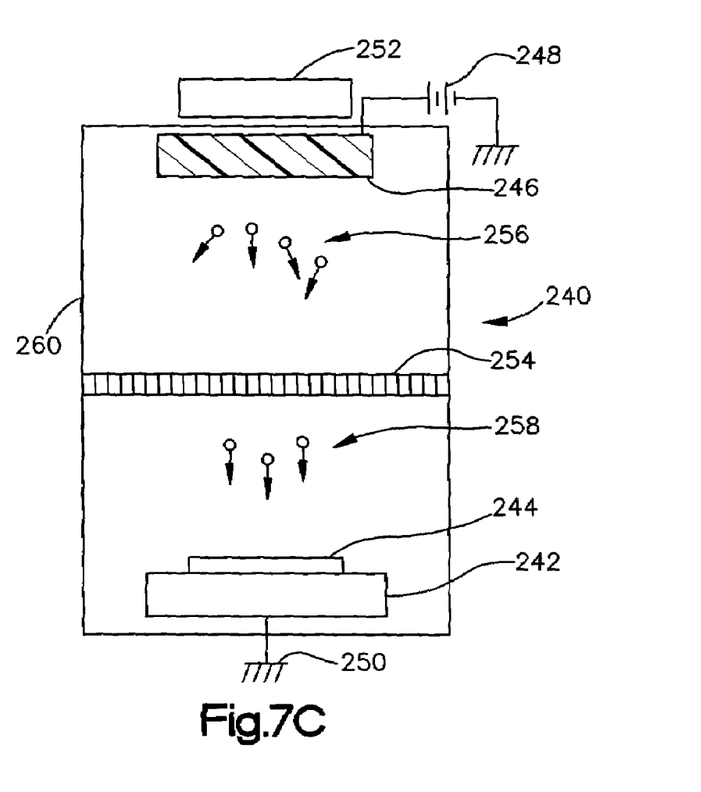

FIG. 7C illustrates a collimated sputtering apparatus 240. The collimated sputtering apparatus 240 may include a substrate holder 242 that can hold a substrate 244 in an essentially parallel orientation to a target 246. The target 246 may be formed from an oxide material that is to be deposited (e.g., $SiO_2$) or the oxide material may be deposited using reactive sputtering from a non-oxidized target. In this case the sputtering gas would contain oxygen that would be incorporated into the film during deposition. The target 246 may be connected to a DC or RF power source 248 while the substrate holder 242 may be connected to ground 250. A magnet 252 may be disposed on one surface of the target 246, while an opposite surface can face the substrate 244. The apparatus 240 further includes a shielding plate, referred to herein as a collimator 254. The collimator 254 may be disposed between the target 246 and the substrate 244.

The collimator 254 may discriminate between sputtered particles 256. More particularly, of the various sputtered particles 256 released from the target 246, the collimator 254 may only allow particular sputterred particles 258 to pass through to the substrate 244. Particular sputterred particles 258 may be those sputterred particles having an essentially vertical incidence with the substrate 244. In this way, in a collimated sputtering method, particular sputterred particles 258 may be selectively passed through to the substrate 244, thereby providing an essentially anisotropic deposition of an oxide material (e.g., $SiO_2$).

As one specific example, a collimated sputtering method may have the following conditions. A sputtering chamber 260 may have an aspect ratio of about 2. A sputtering chamber 260 pressure may be about 2 mTorr to about 10 mTorr. A substrate temperature may be about 150° C. to about 250° C. A DC power may be about 1.0 kW to about 2.0 kW.

Figure 7D:
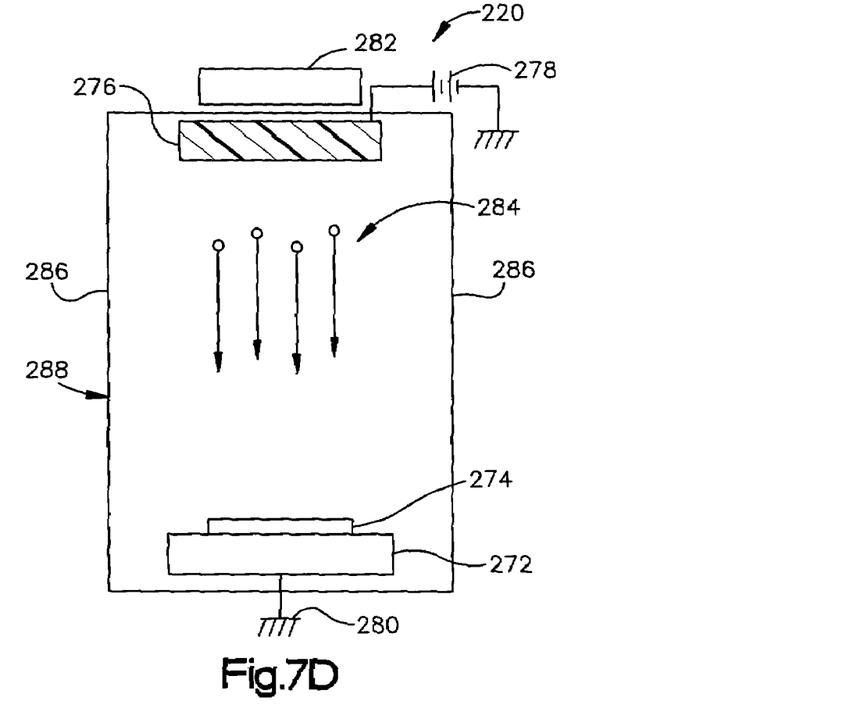

A long throw sputtering apparatus 270 is shown in FIG. 7D. A long throw sputtering apparatus 270 may include a substrate holder 272 that can hold a substrate 274 in an essentially parallel orientation to a target 276. The target 276 may be formed from an oxide material that is to be deposited (e.g., $SiO_2$) or the oxide material may be deposited using reactive sputtering from a non-oxidized target. In this case the sputtering gas would contain oxygen that would be incorporated into the film during deposition.

The target 276 may be connected to a DC or RF power source 278, while the substrate holder 272 may be connected to ground 280. A magnet 282 may be disposed on one surface of the target 276, while an opposite surface can face the substrate 274. The application of a voltage to the target 276 can generate a plasma that results in the emission of sputterred particles from the target 284. The long throw sputtering apparatus 270 may differ from a conventional sputtering apparatus in a chamber pressure and/or in distance between a target 276 and the substrate 274. For example, in a conventional sputtering apparatus, such as that shown in FIG. 7B, sputtering may be conducted at a pressure in the general range of 2.0 to 10.0 mTorr. In contrast, according to one embodiment, a long throw sputtering method may be performed at a lower pressure, such as 1.0 mTorr or less. In addition, or alternatively, the distance between the target 276 and the substrate 274 may be about three to six times longer than in a conventional sputtering apparatus.

A lower sputtering chamber pressure can result in a longer mean free path for sputtering particles 284. Consequently, sputtering particles 284 released from the target 276 may have straighter paths, and not be scattered multiple times, as in a conventional sputtering process.

A longer distance between the target 276 and the substrate 274 may lead to more sputtering particle anisotropy. More particularly, those particles 284 that are released at an angle that is tilted with respect to the substrate 274 (i.e., have substantially non-vertical path components) may attach to sidewalls 286 of a sputtering chamber 288. Thus, substantially most of the sputtered particles 284 that may reach the substrate 274 have an essentially vertical incidence, thereby providing an essentially anisotropic deposition of the oxide material (e.g., $SiO_2$).

Figure 7E:
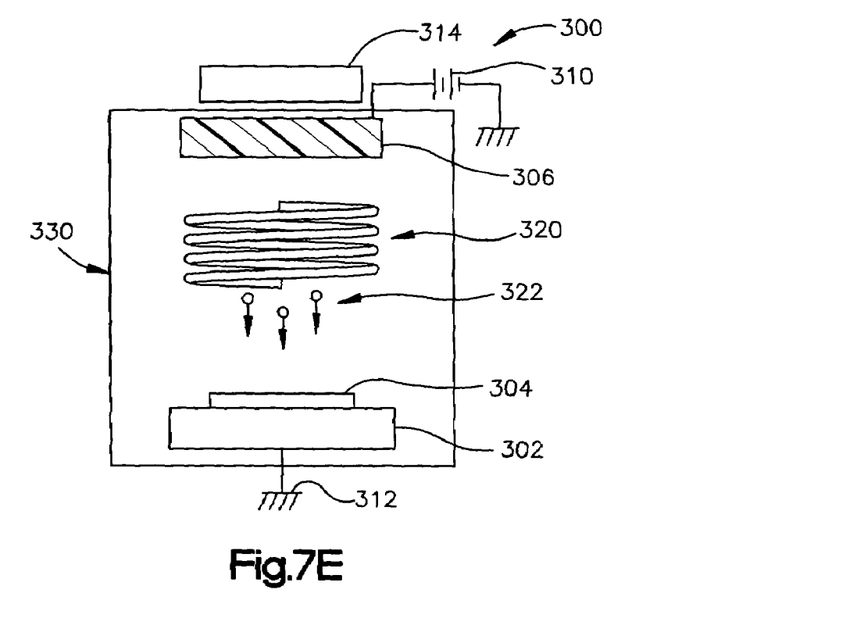

An ionized metal plasma sputtering apparatus 300 is shown in FIG. 7E. An ionized metal plasma sputtering apparatus 300 may include a substrate holder 302. The substrate holder 302 can hold a substrate 304, that is to be processed, in an essentially parallel orientation to a target 306. The target 306 may be formed from a oxide material that is to be deposited (e.g., $SiO_2$) or the oxide material may be deposited using reactive sputtering from a non-oxidized target. In this case the sputtering gas would contain oxygen that would be incorporated into the film during deposition.

The target 306 may be connected to a DC or RF power source 310 while the substrate holder 302 may be connected to ground 312. A magnet 314 may be disposed on one surface of the target 306, while an opposite surface can face the substrate 304. The apparatus 300 further includes a coil 320 disposed between the target 306 and the substrate 304. The coil 320 may be connected to a RF power source (not shown).

The application of a voltage to the target 306 can result in the formation of a plasma in which the ionized species are accelerated into the target material, a portion of which is ejected due to the collision, resulting in sputtered particles 322 being generated. Same comments about formation of plasma and emission of sputtered particles. The coil 320 may generate a high-density inductively coupled RF plasma, which can ionize sputtering particles 322. Such ionized sputtering particles 322 may then be influenced by the electrical field between the target 306 and the substrate 304 to have a vertical incidence with the substrate 304. In this way, in an ion plasma method, sputterred particles 322 are ionized and then influenced by an electrical field to provide an essentially anisotropic deposition of a material (e.g., $SiO_2$).

As but one specific example, an ion metal plasma sputtering method may have the following conditions. A sputtering chamber 330 pressure may be about 20 mTorr. A substrate temperature may be about 150° C. A DC power may be about 2.3 kW. A RF power for the coil 320 may be about 2.8 kW.

It will be further be appreciated that other methods (e.g., laser ablation) and apparatuses can be employed to deposit the oxide material on the top surface 202 of the gate 120 and the adjacent surfaces 204 and 206 of the n-well 100 without depositing the oxide material on the opposing side surfaces 210 and 212 of the gate 120.

Figure 8:
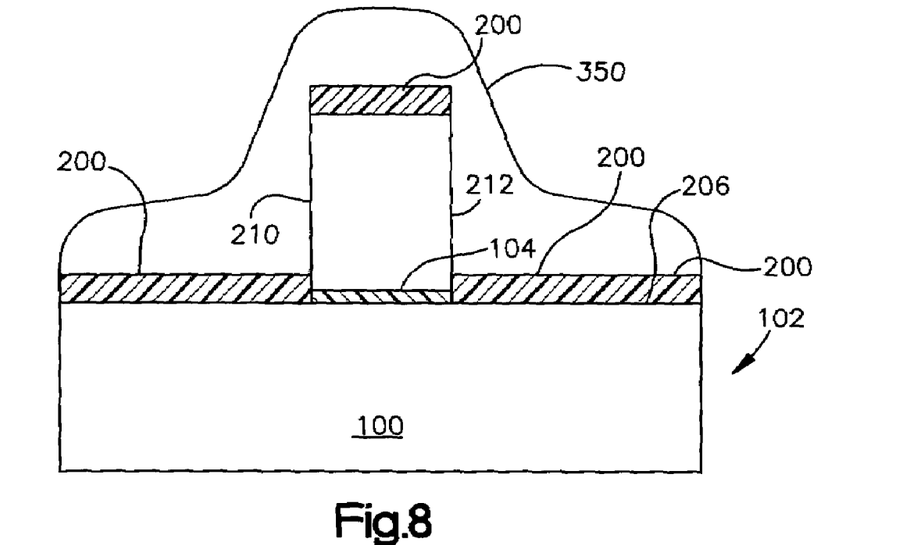
FIG. 8 illustrates a schematic cross-sectional view of the structure of FIG. 7A after a nitride layer has been deposited.

FIG. 8 illustrates that following deposition of the oxide material 200, a layer 350 can be formed over the gate structure. The layer 350 can include any material that can mitigate diffusion of the dopant from the opposing side surfaces 210 and 212 of the gate 120 and reduce electric field effects, which can occur as a result of subsequent heavily doped source/drain implantation. An example of a material that can mitigate diffusion of the dopant from the opposing side surfaces 210 and 212 of the gate 120 and reduce electric field effects is a nitride material, such as silicon nitride. The layer 350 can be formed using any suitable technique including CVD techniques, such LPCVD or PECVD. Other techniques, such as standard deposition techniques and sputtering techniques can also be used.

Figure 9:
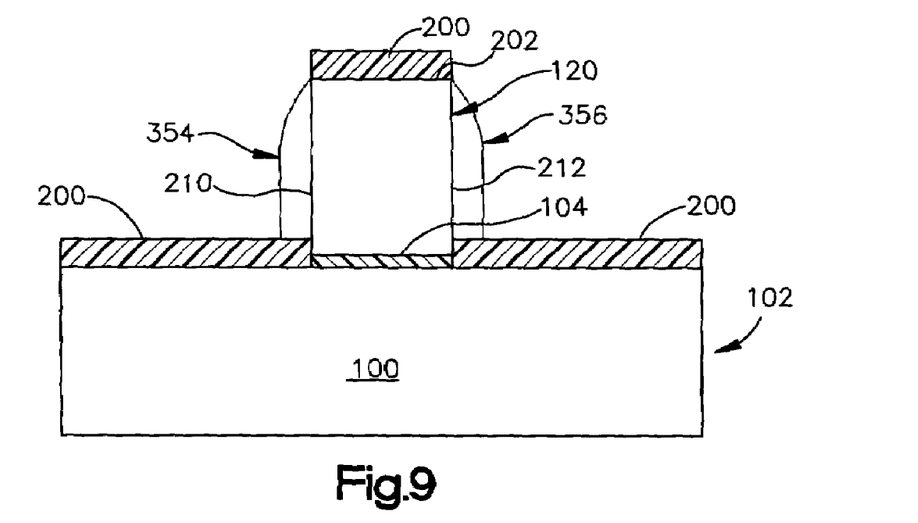
FIG. 9 illustrates a schematic cross-sectional view of the structure of FIG. 8 after nitride offset spacers have been formed.

FIG. 9 illustrates that the layer 350 can be etched (e.g., anisotropic reactive ion etching (RIE)) to provide offset spacers 354 and 356. The offset spacers 354 and 356 mitigate diffusion of the dopant from the opposing side surfaces 210 and 212 of the gate 120 and can mitigate implantation of lightly doped source/drain implants into areas of the n-well 100 substantially proximate the gate 120. The layer 350 can be etched using wet or dry etching. The etching technique can be anisotropic to allow the layer 350 overlying the top surface 202 of the gate 120 to be substantially removed while leaving layers 350 contacting the opposing side surfaces 210 and 212 of the gate 120. For example, a silicon nitride layer 350 can be anisotropically etched with a plasma gas(es), such as carbon tetrafluoride ($CF_4$) containing fluorine ions, in a commercially available etcher, such as a parallel plate RIE apparatus or, an electron cyclotron resonance (ECR) plasma reactor. It will be appreciated that other anisotropic etching techniques are known and can be employed to etch the silicon nitride.

Figure 10:
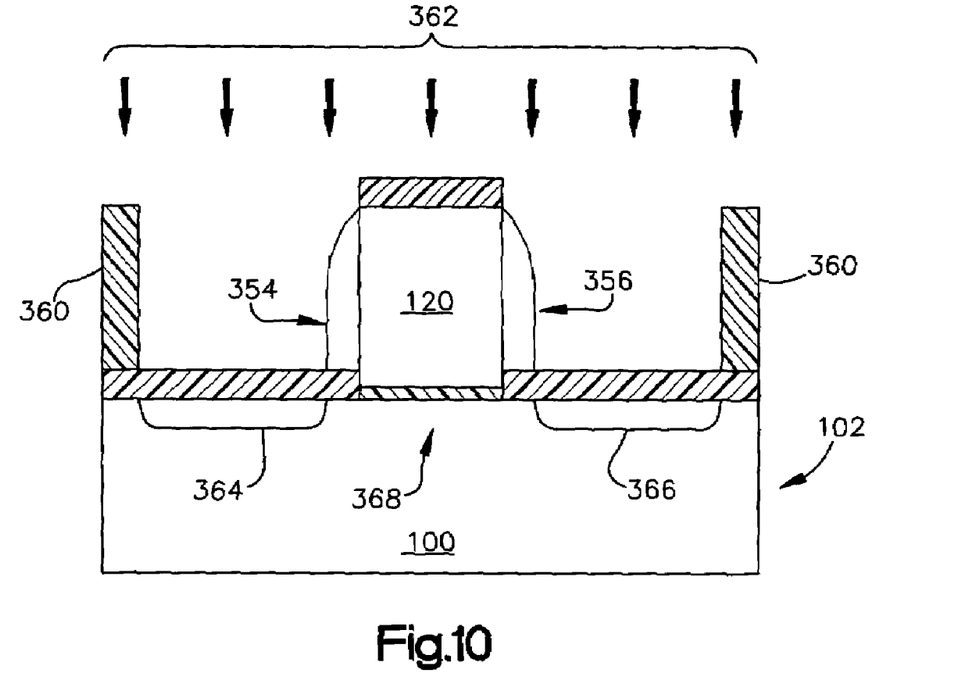
FIG. 10 illustrates a schematic cross-sectional view of the structure of FIG. 9 undergoing implantation of an LDD implant.

FIG. 10 illustrates that following formation of the offset spacers 354 and 356 a patterned photoresist layer 360 can be formed over the n-well 100 laterally spaced from the gate 120. An implantation process 362 can then be initiated to form a shallow lightly doped source region 364 and a shallow lightly doped drain region 366 in the n-well 100 of the p-type substrate 102. The implantation process 362 can be performed using an ion implanter that accelerates p-lightly doped drain implants (LDD implants) into the n-well 100. The p-LDD implants can comprise p-type dopants, such as $B_{11}$ and/or $BF_2$. The p-LDD implant can be optimized depending on the application. Those skilled in the art will understand and appreciate that other dopants can be used as the LDD implant. The LDD implant can be effectively blocked by the patterned photoresist layer 360, the gate electrode 120, and the offset spacers 354 and 356 during implantation of the n-well 100 to define a channel region 368 between the source region 364 and drain region 366. The channel region 368 can be substantially aligned below the gate electrode 120.

After formation of the LDD source region 364 and LDD drain region 366, the patterned photoresist layer 360 can be stripped off the substrate 102 (e.g., ultra-violet (UV) ozone ($O_3$)/sulfuric acid ($H_2SO_4$) and cleaned by wet chemical cleanup processes. Those skilled in the art would be familiar with a variety of different chemical cleanup procedures that can be employed to clean the structure.

Figure 11:
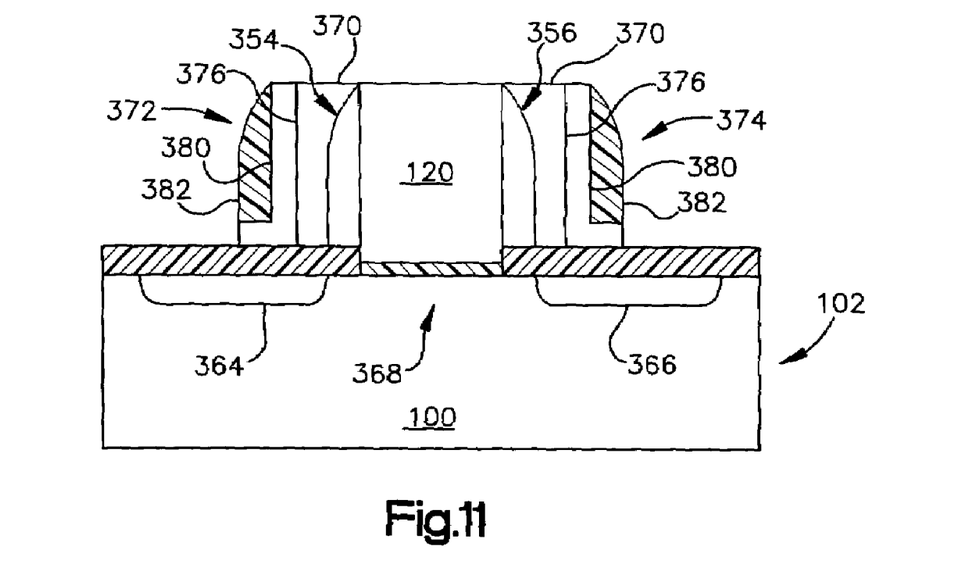
FIG. 11 illustrates a schematic cross-section view of the structure of FIG. 10 after sidewall spacers have been formed adjacent the nitride spacers.

FIG. 11 illustrates that following formation of the LDD source region 364 and LDD drain region 366, a cap layer 370 and a sidewall spacers 372 and 374 can be formed over the n-well 100 adjacent the offset spacers 354 and 356. The cap layer 370 can be formed by depositing an oxide material, such as $SiO_2$, over the n-well 100, the gate 120, and the offset spacers 354 and 356. The cap layer 370 functions as an etching stop during formation of the sidewall spacers 372 and 374. The oxide material can comprise any oxide material typically used as an insulator and as an etching stop during the fabrication of a semiconductor device. Examples of some oxide materials that could be utilized can include $SiO_2$, $AlO_3$, $ZrO_2$, $HfO_2$ (AlHf) $O_x$, $HfO_2$, $La_2O_3$, $Y_2O_3$, silicon oxynitride, and hafnium silicon oxynitride. The oxide material can be deposited using any suitable technique including CVD techniques, such as LPCVD or PECVD. Other techniques, can also be used, provided that they result in sufficient sidewall coverage. It is to be further understood and appreciated that other material besides oxide materials can be used to form the cap layer 370.

The sidewall spacers 372 and 374 can be formed over an outer surface 376 of the cap layer 370 and be laterally displaced from the gate 120 and the offset spacers 354 and 356. The sidewall spacers 372 and 374 can mask the implantation of a heavy dose source/drain implant into the n-well 100. The sidewall spacers 372 and 374 can each include a nitride layer 380 and an oxide layer 382. The nitride layer 60 can be formed from a nitride material (e.g., $Si_3N_4$) that can be deposited over the cap layer 370. The nitride material can be deposited using any suitable technique including CVD techniques, such as LPCVD or PECVD. Other techniques can also be used provided that they result in sufficient sidewall coverage.

The oxide layer 382 can be formed from an oxide material that can be deposited (e.g., by CVD) over the nitride layer 380. The oxide material can comprise any oxide material typically used as an insulator and as an etching stop during the fabrication of a semiconductor device. Examples of some oxide materials that could be utilized as the oxide material can include $SiO_2$, $AlO_3$, $ZrO_2$, $HfO_2$ (AlHf) $O_x$, $HfO_2$, $La_2O_3$, $Y_2O_3$, silicon oxynitride, and hafnium silicon oxynitride. The oxide material can be deposited using any suitable technique including CVD techniques, such as LPCVD or PECVD. Other techniques can also be used provided that they result in sufficient sidewall coverage. It is to be further understood and appreciated that other oxide materials can also be used.

The deposited oxide layer 382 and nitride layer 380 can be etched using wet or dry etching to form the sidewall spacers 372 and 374. The etching technique can be anisotropic to allow any portion of the oxide layer 382 and nitride layer 380 overlying the top surface 202 of the gate 120 to be substantially removed while leaving oxide layer 382 and nitride layer 380 overlying the outer surface 376 of the cap layer 370.

Figure 12:
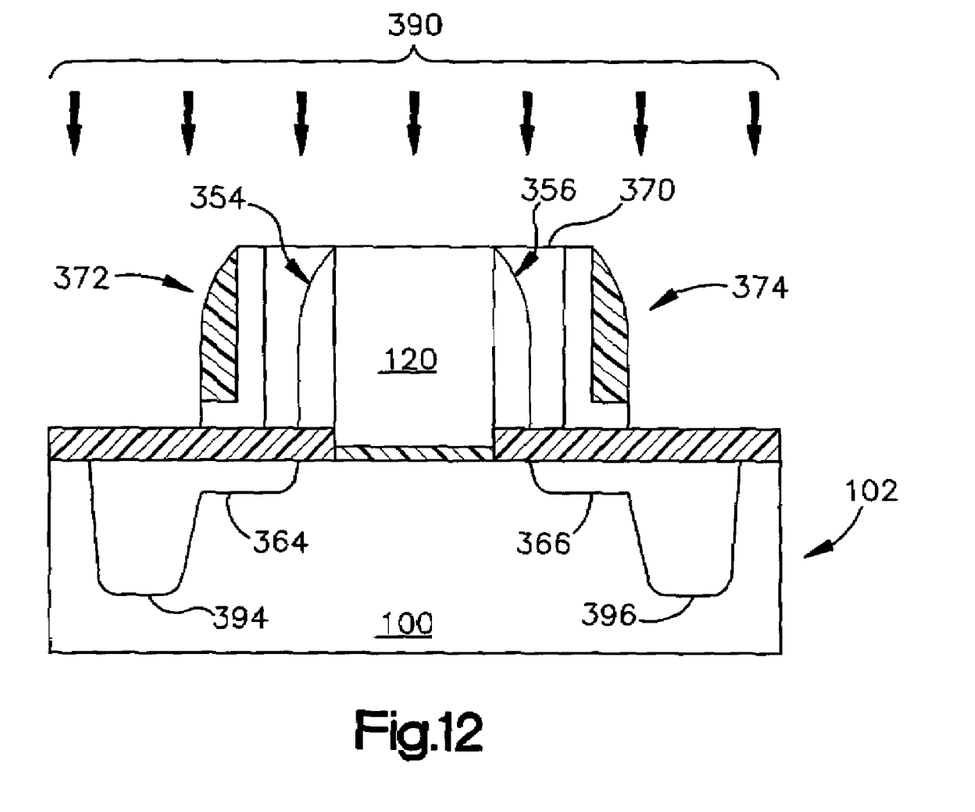
FIG. 12 illustrates a schematic cross-sectional view of the structure of FIG. 11 after ion implantation has been initiated to form the source and the drain regions.

FIG. 12 illustrates that following formation of the sidewall spacers 372 and 374, an implantation process 390 can be initiated to implant a heavy dose $p^+$ source/drain implant, such as $B^{11}$ and/or $BF_2$. The $p^+$ source/drain implant can be effectively blocked by the gate electrode 120 and the sidewall spacers 372 and 374 during implantation into the n-well 100. The $p^+$ source/drain implant penetrates the n-well 100 to slightly below the LDD regions 364 and 366 to define source and drain regions 394 and 396 with a high $p^+$ impurity content.

Additional processing steps can be performed to complete the PMOS structure after formation of the source region 394 and the drain region 396. For example, the source region and drain region can be silicided to reduce contact resistance.

Those skilled in the art will also understand and appreciate that variations in the processing operations can be utilized in the formation of a gate structure in accordance with an aspect of the present invention. For example, it is to be appreciated that an n-type substrate material can be provided instead of providing a p-type substrate material and forming an n-well in the p-type substrate material. It is also to be appreciated that trench isolation regions can be formed in the substrate to define an active region in which the n-well is formed. Additionally, it is to be appreciated that the PMOS structure can be annealed after implanting the n-well implant. Moreover, it is to be appreciated that instead of forming a PMOS structure, an NMOS structure can be formed in the substrate, or that a plurality of NMOS and PMOS structures can be formed in the substrate, such as part of a CMOS process. The NMOS structure can have $n^-$ and $n^+$ source/drain regions instead of $p^-$ and $p^+$ source/drain regions. It is further to be appreciated, that a control gate can be formed over the oxide layer overlying the gate. The control gate layer can then be etched to form a stacked gate structure.

What has been described above includes examples and implementations of the present invention. Because it is not possible to describe every conceivable combination of components, circuitry or methodologies for purposes of describing the present invention, one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of fabricating a semiconductor device, the method comprising:
   forming a gate on a semiconductor substrate, the gate including opposing side surfaces and a top surface;
   after forming the gate, selectively depositing an oxide material comprising at least one material from the group consisting of $AlO_3$, $ZrO_2$, $HfO_2$ (AlHf) $O_x$, $HfO_2$, $La_2O_3$, $Y_2O_3$, silicon oxynitride, and hafnium silicon oxynitride substantially on the top surface of the gate, as well as over the semiconductor substrate, the opposing side surfaces of the gate being substantially free of the oxide material; and
   forming spacers on the opposing side surfaces of the gate subsequent to depositing said oxide material, the spacers contacting the opposing side surfaces of the gate substantially along the opposing side surfaces.

2. The method of claim 1, the gate being doped with p-type or n-type dopant.

3. The method of claim 1 wherein the oxide material is deposited by physical vapor deposition.

4. The method of claim 3, the physical vapor deposition method comprising at least one of a collimated sputtering method, a long throw sputtering method, or an ionized metal plasma sputtering method.

5. The method of claim 1, the formation of the spacers further comprising providing a nitride layer over the gate after depositing the oxide material; and etching the nitride layer.

6. The method of claim 5, further comprising implanting an LDD implant after forming the gate, but before depositing the oxide layer; and implanting a source/drain implant after forming the nitride spacers.

7. The method of claim 6, the LDD implant and the source/drain implant forming a source region and a drain region of the semiconductor device.

8. The method of claim 7, the gate forming part of a p-type metal oxide semiconductor (PMOS) structure.

9. A method of fabricating a semiconductor device, the method comprising:
   forming a doped gate have a top surface and opposing side surfaces on a semiconductor substrate;
   after forming the gate, selectively depositing an oxide material comprising at least one material from the group consisting of $AlO_3$, $ZrO_2$, $HfO_2$ (AlHf) $O_x$, $HfO_2$, $La_2O_3$, $Y_2O_3$, silicon oxynitride, and hafnium silicon oxynitride substantially on the top surface of the doped gate, as well as over the semiconductor substrate, the opposing side surfaces of the gate being substantially free of the oxide material;
   forming a nitride layer over the gate and the oxide material; and
   etching the nitride layer to form nitride spacers on the opposing side surfaces of the gate, the nitride spacers contacting the opposing side surfaces of the gate substantially along the opposing side surfaces.

10. The method of claim 9, the nitride spacers mitigating diffusion of dopants from the opposing side surfaces of the gate.

11. The method of claim 9, the oxide material being deposited by physical vapor deposition.

12. The method of claim 11, the physical vapor deposition method comprising at least one of a collimated sputtering method, a long throw sputtering method, or an ionized metal plasma sputtering method.

13. The method of claim 9, further comprising: implanting a LDD implant after forming the gate, but before depositing the oxide layer; and implanting a source/drain implant after forming the nitride spacers.

14. The method of claim 9, the gate forming part of a semiconductor device comprising a PMOS structure.

15. The method of claim 1 wherein depositing an oxide material over the gate, as well as over the semiconductor substrate and on a side of the gate, includes depositing an oxide material on the gate and on the semiconductor substrate.

16. The method of claim 1 wherein forming a gate on a semiconductor substrate includes forming a conductive layer over the substrate, and patterning the conductive layer to form the gate.

* * * * *